(12) United States Patent
Chang et al.

(10) Patent No.: US 6,330,122 B1
(45) Date of Patent: Dec. 11, 2001

(54) MAGNETIC TESTER FOR DISK SURFACE SCAN

(75) Inventors: Thomas Young Chang, San Jose; Shanlin Duan, Fremont; Terence Tin-Lok Lam; Wai C. Leung, both of San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/317,664

(22) Filed: May 24, 1999

(51) Int. Cl.$^7$ .................................................. G11B 27/36
(52) U.S. Cl. ........................... 360/31; 360/234.3; 360/319
(58) Field of Search ................................ 360/25, 31, 53, 360/234.3, 319, 313

(56) References Cited

U.S. PATENT DOCUMENTS

| | | | |
|---|---|---|---|
| 3,740,736 | 6/1973 | Dion et al. | 360/25 |
| 3,781,835 | 12/1973 | Dion et al. | 360/25 |
| 3,962,724 | 6/1976 | Koizumi | 360/31 |
| 3,984,763 | 10/1976 | Koester et al. | 360/31 |
| 4,203,137 | 5/1980 | Beck et al. | 360/31 |
| 5,032,932 | 7/1991 | Kogure et al. | 360/31 |
| 5,699,204 | * 12/1997 | Inbar | 360/31 |
| 5,998,994 | * 12/1999 | Mori | 360/75 |

FOREIGN PATENT DOCUMENTS

| | | |
|---|---|---|
| 55-64622 A | 5/1980 | (JP) . |
| 57-105814 | 7/1982 | (JP) . |
| 58-119062 | 7/1983 | (JP) . |
| 1-298507 A | 12/1989 | (JP) . |
| 04-216311 | 8/1991 | (JP) . |

OTHER PUBLICATIONS

IBM Technical Disclosure Bulletin, "Thermomagnetic Writing/Magnetoresistive Reading on Ferromagnetic Disk"; vol. 34, No. 2, Jul. 1991; pp. 481, 482.

* cited by examiner

Primary Examiner—Regina Y. Neal
(74) Attorney, Agent, or Firm—Robert O. Guillot; Oppenheimer Wolff & Donnelly LLP (57) ABSTRACT

The hard disk testing and certifying device of the present invention includes a spin stand to rotate a disk to be tested. A single read/write head, including both a write head and a read head is mounted upon an armature which movably supports the read/write head. The device includes a computerized control system and signal processing system that provides write signals to the write head and receives and processes read head signals from the read head. In the preferred embodiment the read/write head simultaneously provides write signals to the disk and receives read signals from the disk. Preferably, the read/write head functions continually and the certification testing is conducted utilizing a spiral path. In the preferred read/write head the read head is disposed behind the write head and an electromagnetic field shield is disposed between them to reduce electromagnetic field interference between the write head and the read head during simultaneous operation. The read/write head may also include an electromagnetic field interference element to further reduce signal interference at the read head.

24 Claims, 9 Drawing Sheets

MAGNETIC TESTER FOR DISK SURFACE SCAN

BACKGROUND OF THE INVENTION

1. Field of the Invention

The present invention relates generally to devices and methods for certifying hard disks, and more particularly to certifying devices that simultaneously write and read information to and from the disk during the certification process.

2. Description of the Prior Art

A common challenge facing media manufacturers today is the rapidly increasing cost associated with the magnetic certification step in fabrication of hard disks. As a result of the accelerating number of tracks on the disk surface, testing time has increased rapidly.

Additionally, large capital expenditures for new testers, as well as high maintenance and operations costs are being incurred.

There are generally two types of magnetic disk certification testing devices in use today. The first type operates in a track-to-track stepping mode in which the write head first moves and settles on one track. After settling, a pattern is written on the track. Then, at least one disk revolution is required before the written pattern can be read back. In this type of device the drifting of the read/write head between the write revolution and the read revolution must be carefully controlled. This control is currently becoming a major problem because the track width has decreased due to advances in hard disk drive technologies, and because the write head element width has become closer to the read head element width. The combination of these two factors causes the tolerances for head drifting to decrease exponentially. To control the head drift, a significant waiting time may be required after the head steps from one track to the next, for the scanner to settle down to a stable position. Therefore, in this type of prior art certification testing, particularly where speed and cost are significant factors, as few as 100 to 200 tracks are tested on a disk containing thousands of tracks. Certification is then based on a small percentage of tracks tested and statistical methods are utilized to determine whether the number of defects detected will constitute rejection or acceptance of a disk.

The second type of disk certifier operates in a spiral-scanning mode wherein two heads are located on the disk apart from each other. One head performs the writing operation and the other performs the reading operation. Two scanners, two controllers and two electronic signal processing systems are needed for the scanning of the two heads. The advantage of this type of tester is that it can theoretically achieve very high efficiency (e.g., one revolution/track is possible). However, the major drawbacks of this type of disk certification tester are that since the two heads are located rather far from each other, stringent location-alignment precision must be maintained between the two heads in order for the read head to always read on-track with the write head, and a scanning speed equivalency must be maintained between the two scanners during scanning. Furthermore, due to the two head element arrangement, once the tester is set up for a specific configuration, it is difficult to change the configuration parameters (rpm, scanning speed, number of tracks tested, etc.) should the need arise. It is believed that these are among the reasons that many media manufacturers currently use the track-to-track stepping type testers.

SUMMARY OF THE INVENTION

The hard disk testing and certifying device of the present invention includes a spin stand to rotate a disk to be tested. A single read/write head, including both a write head element and a read head element is mounted upon an armature which movably supports the read/write head. The device includes a computerized control system and signal processing system that provides write signals to the write head element and receives and processes read head signals from the read head element. In the preferred embodiment the read/write head simultaneously provides write signals to the disk and receives read signals from the disk. Preferably, the read/write head functions continually and the certification testing is conducted utilizing a spiral path. In the preferred read/write head the read head element is disposed behind the write head element and an electromagnetic field shield is disposed between them to reduce electromagnetic field interference between the write head element and the read head element during simultaneous operation. The read/write head may also include an electromagnetic field interference element to further reduce write head signal interference at the read head element.

It is an advantage of the present invention that hard disks can be certified faster.

It is another advantage of the present invention that hard disks can be certified less expensively.

It is a further advantage of the present invention that a larger surface area of a hard disk can be economically tested.

It is yet another advantage of the present invention that certification testing of a hard disk can be accomplished utilizing a read/write head that detects disk defects in a similar manner to a read/write head in a disk drive.

It is yet a further advantage of the present invention that a larger surface area of a hard disk can be tested in the same time period as prior art certification devices.

These and other features and advantages of the present invention will become apparent to those skilled in the art upon reading the following detailed description which makes reference to the several figures of the drawings.

DETAILED DESCRIPTION OF THE PREFERRED EMBODIMENTS

A significant feature of the present invention is that it functions with simultaneous write and read operations using a single head. This allows for the immediate read-back of written signals without waiting for even one disk revolution, and it facilitates the spiral scanning of a disk surface. With these features, the present invention achieves the theoretical optimum testing efficiency of one revolution per track; that is, if the tester is set up to spin at 10000 revolutions per minute, then it can test close to 10000 tracks within one minute. This compares with conventional testers which may require many revolutions per track. To achieve this high efficiency, a novel read/write head with simultaneous write and read capability is utilized. In addition, the tester scanning mechanism works in a continuous scanning mode, and the test algorithm is structured to perform continuous, concurrent write and read functions. Thus, the implementation and operation of the present invention is low in cost, the alignment requirements of the head position are low, and there is no special requirement for scanning speed accuracy or stability. Additionally, some of the existing read-write electronics for disk certification can be utilized. The detailed features of the preferred embodiments of the present invention are next described.

Figure 1:
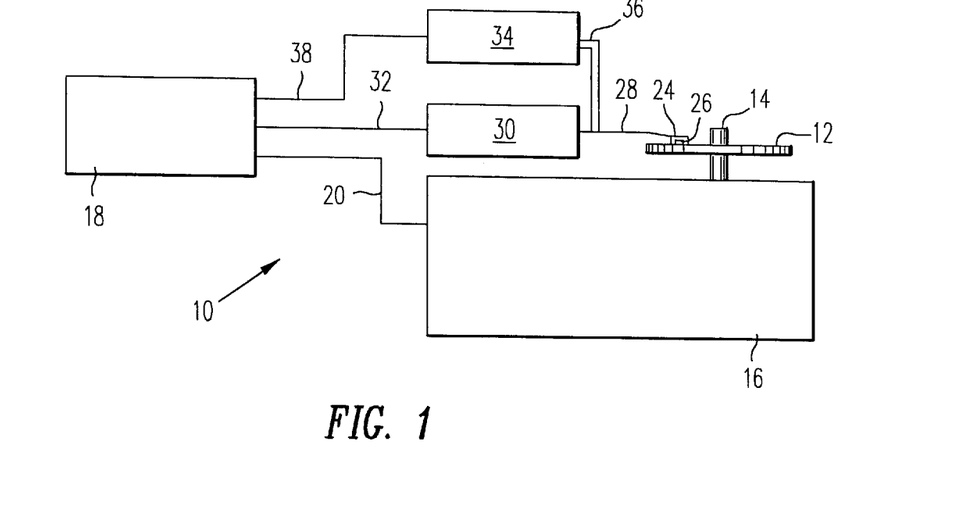
FIG. 1 is a block diagram of the disk certification system of the present invention.
Figure 2:
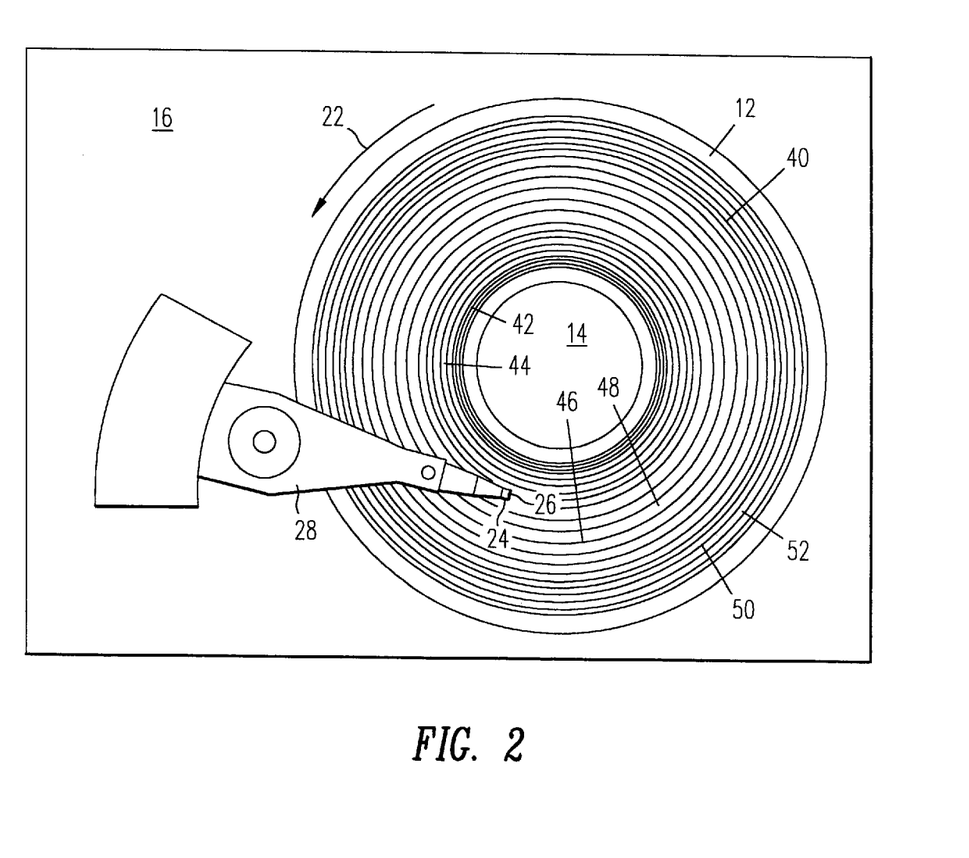
FIG. 2 is a top plan view of the tester spin stand portion of FIG. 1.

FIG. 1 is a block diagram of the disk certification system 10 of the present invention, and FIG. 2 is a top plan view of the spin stand portion of the disk certification system of FIG. 1. As depicted in FIGS. 1 and 2, a hard disk 12 to be tested is mounted upon a rotating spindle 14 of a spin stand 16 that is controlled by a certification testing computer 18 through control line 20, such that the disk 12 rotates in the direction of arrow 22. A slider 24 including a novel read/write head 26 of the present invention, is mounted on an armature 28, and movement of the armature 28 is controlled by a scanner 30 which is controlled by the computer 18 through control line 32. The read/write head 26 is electrically engaged to the read/write head control electronics 34 through lead lines 36, and the read/write head control electronics 34 are connected to the computer 18 through a control line 38. It is therefore to be understood that while the disk 12 is rotated by the spindle 14, the movement of the read/write head 26 on the armature 28 is controlled by the scanner 30, and the read/write head control electronics 34 simultaneously provides write signals to a write head of the read/write head 26 and receives read signals from a read head of the read/write head 26. The computer 18 tests for read bit errors that are identified as defects in the disk.

While the certification system 10 can test a disk by writing discrete tracks for read back, in the preferred certification method of the present invention spiral scanning is performed. It is enabled by the orientation of the write head followed by the read head and their continuous, simultaneous operation. In spiral certification, a continuous spiral track 40 is written onto the disk 12 and read from the disk simultaneously. It has been found through the certification testing of many disks, that the larger majority of disk defects are found on the radially inner disk surface areas and the radially outer disk surface areas, as opposed to the centrally disposed surface areas of the disk. Therefore, a preferred spiral track certification testing method of the present invention is to utilize a relatively tight spiral 42 in certification of the inner portions 44 of the disk 12, a relatively loose spiral 46 in testing the central portions 48 of the disk 12 and a tighter spiral 50 when testing the outer portions 52 of the disk 12. In this manner the disk certification testing of the present invention may be more rapidly performed and advantageously concentrated in those areas that generally contain the greater percentage of defects.

Figure 3:
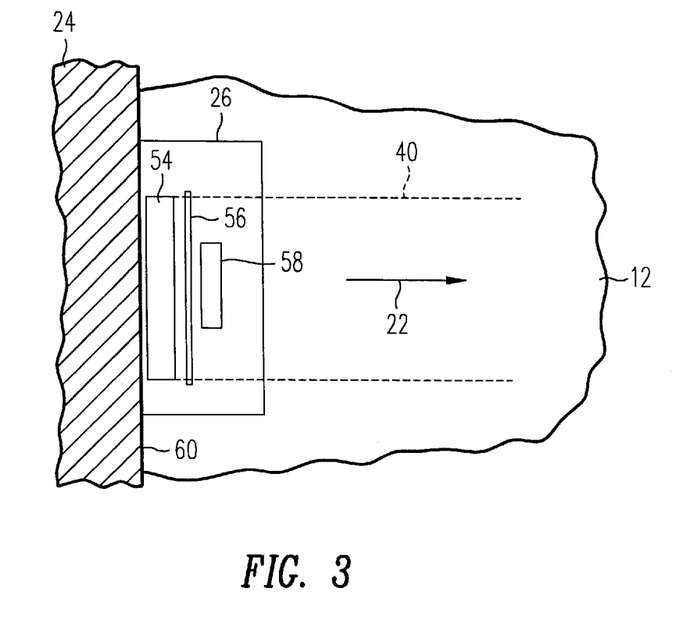
FIG. 3 is a representative top plan view of the disposition of the read/write head of the present invention relative to a certification track where the skew angle is zero degrees.
Figure 4:
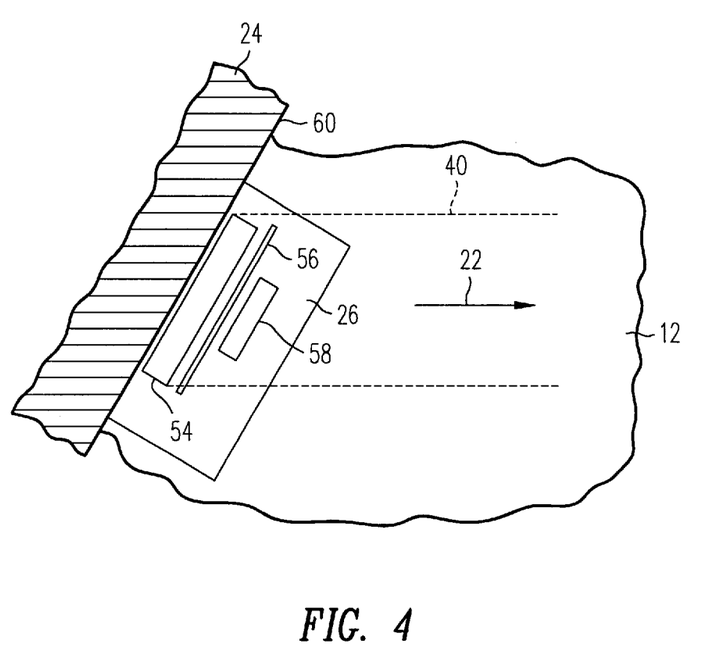
FIG. 4 is a representative top plan view of the disposition of the read/write head of the present invention relative to a certification track where the skew angle is 30 degrees.

FIGS. 3 and 4 are top plan views which depict the track writing and certification orientation of the read/write head of the present invention, wherein FIG. 3 depicts a skew angle of zero degrees and FIG. 4 depicts a skew angle of 30 degrees. In the preferred embodiment, the read/write head 26 of the present invention is disposed on a slider 24 that is mounted on an armature 28 that is similar to a user's hard disk drive arm and slider. Thus, the read/write head 26 of the present invention that performs the disk certification is oriented relative to the disk surface just as the read/write head of the ultimate user's hard disk drive will be oriented, and defects that cause failure in a user's disk environment will be more readily detected during certification, whereby such disks will not pass certification. This avoids a prior art problem where the certification head has a different orientation than the orientation of the user's hard disk drive head, and disks that pass certification later fail due to the differing orientation of the certification read head and the user's hard disk drive read head.

As depicted in FIGS. 3 and 4 and described in detail hereinbelow, the read/write head 26 of the present invention includes a write head 54 and a read head 58 that are disposed on the rearward surface 60 of the slider 24 such that the write head 54 is disposed proximate the rear surface 60 of the slider 24 and the read head 58 is disposed behind the write head 54. Thus, in the preferred embodiment, information that is written by the write head 54 can be subsequently read by the read head 58 where the write head 54 and read head 58 function simultaneously. As is described in greater detail hereinbelow, the read/write head 26 preferably includes an electromagnetic field shield device 56 that is disposed between the write head 54 and the read head 58. The shield 56 functions to facilitate the simultaneous operation of the write head 54 and read head 58 by absorbing the electromagnetic field that is generated by the operation of the write head 54.

As shown in FIGS. 3 and 4, the width of the written data track 40 is determined by the width of the write head 54. Thus, in FIG. 3, where the skew angle is zero degrees, the full width of the write head 54 determines the width of the track. The read head 58 has a smaller width than the write head 54, whereby the read head 58 is centrally disposed within the written track. In FIG. 4, the skew angle of 30 degrees results in a substantially reduced track width because the write head 54 is disposed at a 30 degree angle relative to the direction 22 of the disk, and thus the direction of the track 40. However, because the read head 58 has a smaller width than the write head 54, it is seen that the read head 58 is still disposed within the written track 40 of the write head 54. Thus, the write head 54 is preferably designed to be significantly wider than the read head 58, and the read head 58 is preferably designed to be generally the same width as the user's hard disk drive read head, so as to maintain the same defect sensitivity that the user will experience.

Another significant factor is the distance between the write head and the read head, as the closer the read head is to the write head the more on track it will be. In the present invention the distance between the read head 58 and the write head 54 can be as close as approximately 1.5 microns to approximately 35 microns, whereby the off track problems associated with skew angle variations are minimized. Additionally, where the read head 58 is disposed closely behind the write head 54, problems associated with the vibration of the read/write head 26 are minimized. That is, the time between write and read is so short compared to vibration time, and any off track movement is so small in that time duration, that the head vibration is not a problem. Therefore, due to its relatively small width and close proximity, the read head 58 is designed to be always on the written track of the write head 54, regardless of the skew angle. Preferred embodiments of the read/write head 26 that facilitate the continuous, simultaneous write and read functions of the present invention are next discussed.

Figure 5:
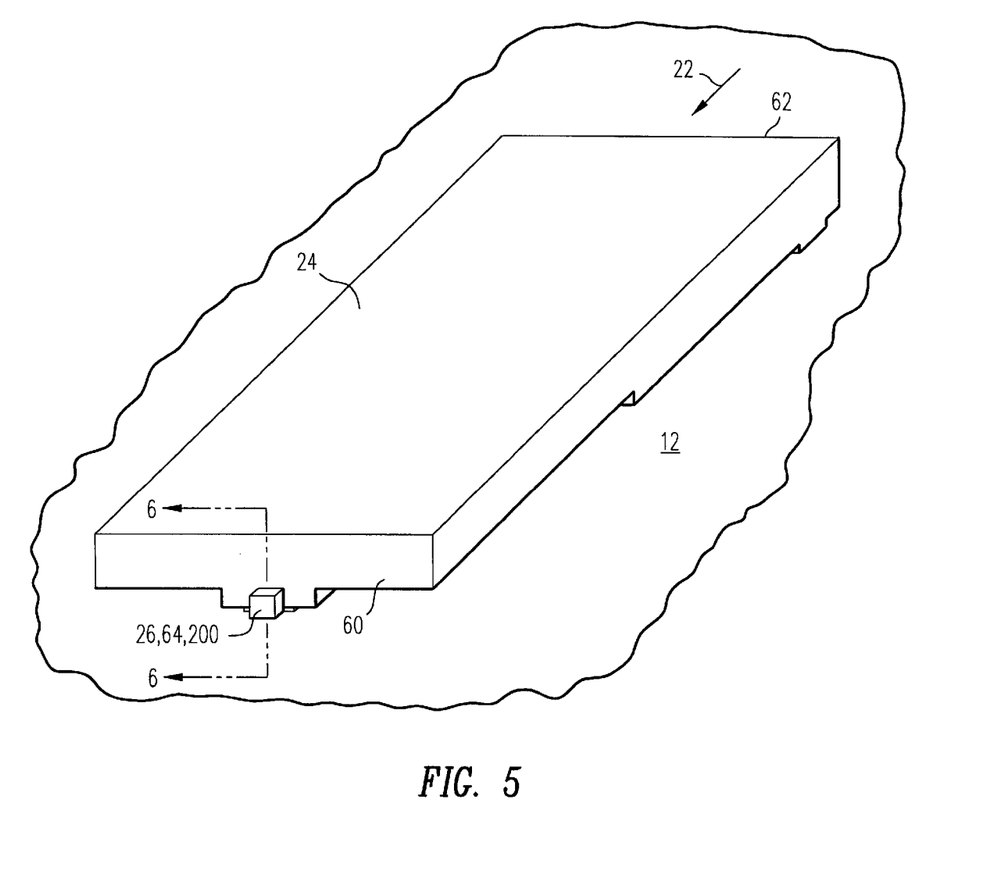
FIG. 5 is a perspective view of a typical hard disk drive slider having a read/write head of the present invention disposed on a rearward surface thereof.

As depicted in FIG. 5, a novel read/write head 26 that is utilizable in the present invention is disposed on the rearward surface 60 of a typical slider 24 of the disk certification device 10 of the present invention. The slider 24 is typically designed to fly above the surface of the hard disk 12 to be tested, which rotates in the direction of arrow 22 from the leading surface 62 of the slider 24 towards the rearward surface 60. Fly height tends to decrease with increasing recording density requirements; therefore, near-contact and contact recording are being explored for future application in disk drives. The present invention can also be used beneficially in drives using near contact and contact recording. The novel features of a first preferred embodiment 64 of the read/write head 26 that is utilized in the present invention are best understood in conjunction with FIGS. 6, 7 and 8 as are next discussed.

Figure 6:
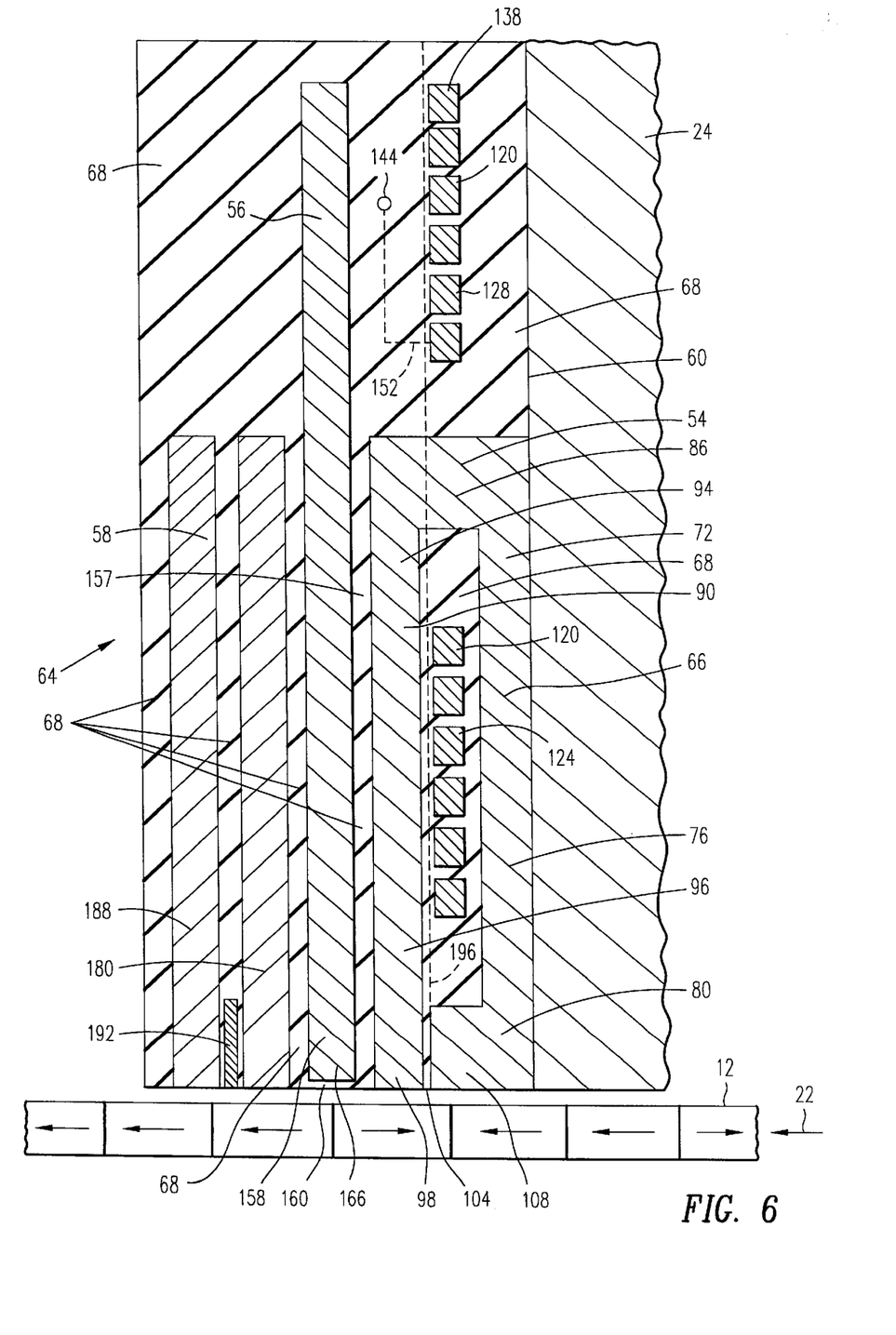
FIG. 6 is a cross-sectional view of read/write head according to a first embodiment of the present invention, taken along lines 6—6 of FIG. 5.
Figure 7:
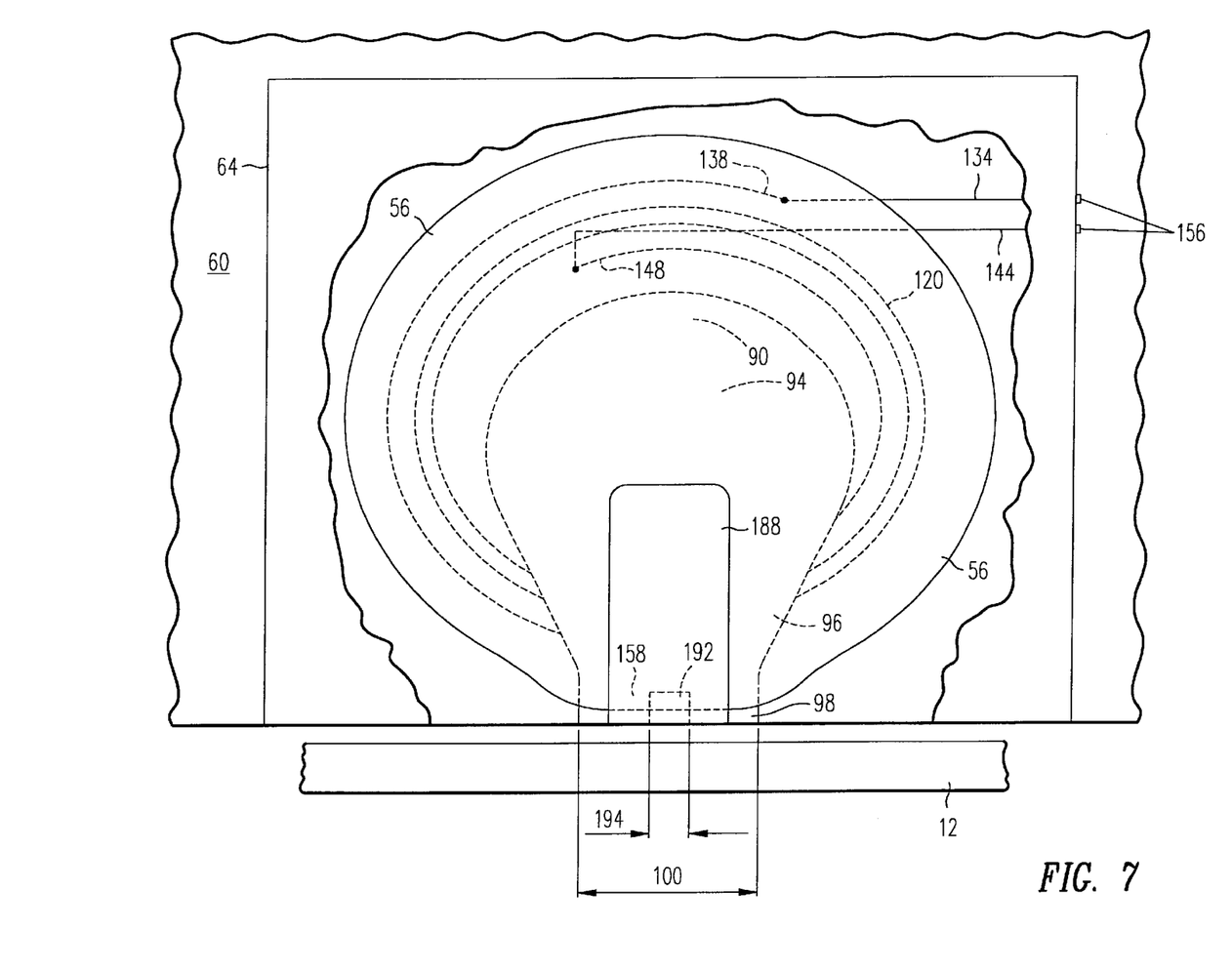
FIG. 7 is an elevational view of the read/write head depicted in FIG. 5 having cut-away portions.
Figure 8:
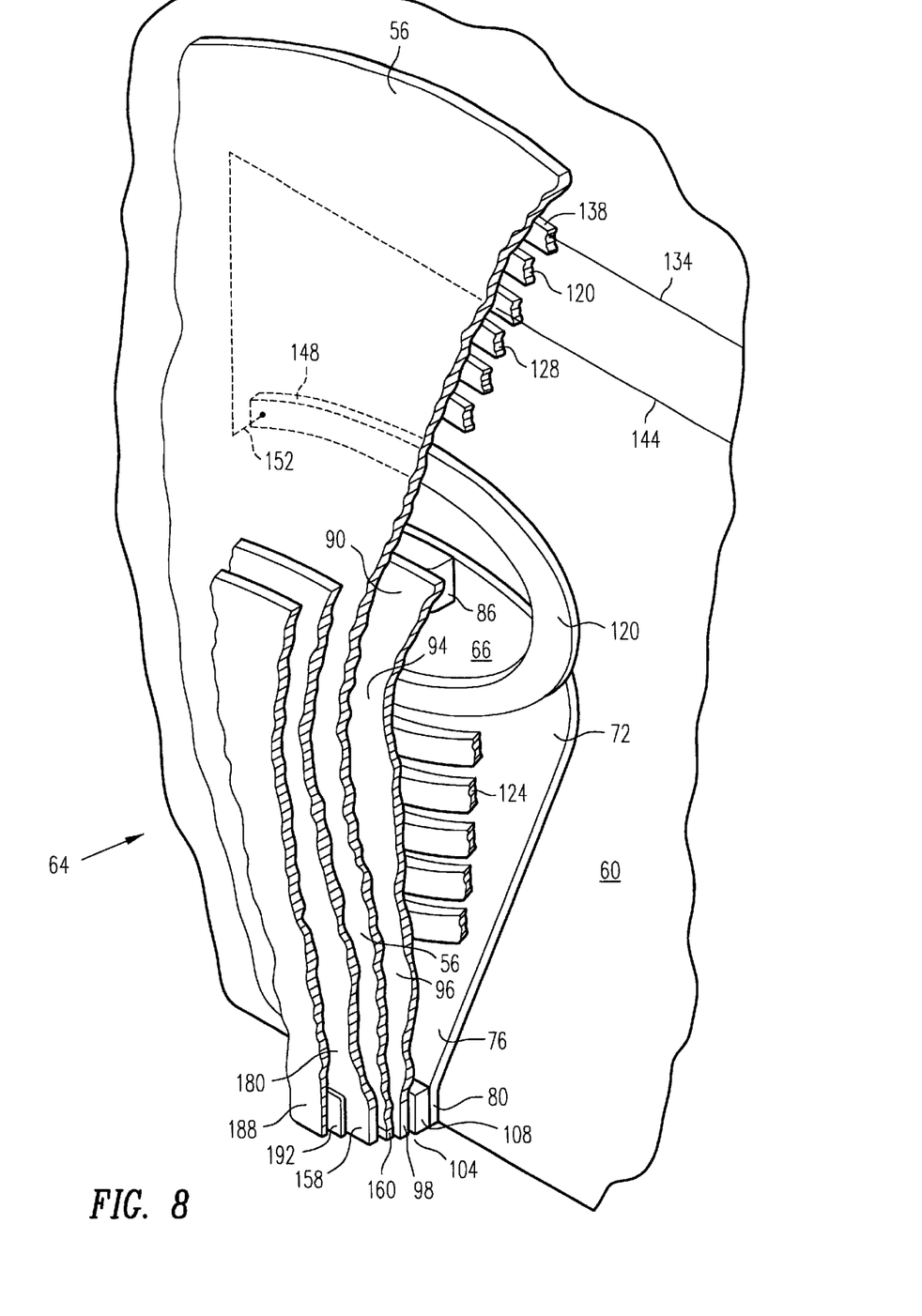
FIG. 8 is a perspective view of the read/write head depicted in FIG. 7 with further cut-away portions to better depict the invention.

FIG. 6 is a side cross-sectional view of the read/write head 64 taken along lines 6—6 of FIG. 5, FIG. 7 is an elevational view of the read/write head 64 having cut-away portions to depict the internal components thereof, and FIG. 8 is a perspective view of the read/write head 64 having cut away portions to better depict its components. As depicted in FIGS. 6, 7 and 8, the read/write head 64 generally includes an inductive write head 54 that is formed on the rearward surface 60 of the slider 24, an electromagnetic field shield 56 that is formed on the outward side of the write head 54, and a magnetoresistive (MR) read head 58 that is formed on the outward side of the electromagnetic field shield 56. The various elements of the read/write head 64 are manufactured utilizing thin film deposition techniques that are well known in the art.

The write head 54 includes a first pole piece 66 that is formed on the rearward surface 60 of the slider 24. Insulator material 68 is deposited between the various active components of the write head 54, shield 56 and read head 58, as is known to those skilled in the art. The first pole piece 66 of the inductive write head 54 is formed with an enlarged upper section 72 which tapers to a narrow lower section 76 and terminates at its lower end in a relatively narrow pole tip 80. A pole connector element 86 joins the upper end 72 of the first pole piece 66 to the upper end 90 of a second pole piece 94. The second pole piece 94 is formed with the generally same shape as the first pole 66; that is, it has an enlarged upper end 90 and a narrowed lower end 96 which terminates in a narrow pole tip 98 having a width 100. The width 100 of the second pole tip 98 need not be the same as the width of the first pole tip 80. A writing gap 104 is formed between the lower tips 80 and 98 of the first and second pole pieces respectively by a gap forming piece 108 formed on the tip 80 of the first pole piece 66. The width (W) of the gap forming piece 108 determines the width of the data writing track.

An induction coil 120 is utilized to create the magnetic field that is focused by the pole pieces 66 and 94. The induction coil 120 has a generally circular, spiral shape and is formed with lower turn portions 124 that pass between the pole pieces 66 and 94, and upper turn portions 128 that pass outside of the pole pieces 66 and 94. To provide electrical power to the induction coil 120, a first electrical lead 134 is engaged to an outer end 138 of the coil 120 and a second electrical lead 144 is engaged to an inner end 148 of the induction coil 120. The thin film deposition processing techniques that form the lead 144 may include the formation of vias 152 to direct the lead 144 out of the plane of the induction coil 120 and towards the external electrical connection terminals 156.

Inductive writing heads are known in the prior art to have shapes and sizes that differ from the embodiment of write head 40 described herein, and the present invention is intended to not be limited to the characteristics of the preferred embodiment of the write head 40 described herein.

After the deposition of an insulation layer 157, the electromagnetic field shield 56 is next deposited on the outward side of the write head 54. The shield 56 is generally circular in shape in order to provide a shield for the generally circular, spiral induction coil 120, and the diameter of the shield 56 is generally at least as large as the diameter of the induction coil 120. The MR read head 58 includes several components which will be described below. The shield 56 is disposed between the coil 120 and the MR read head 58 such that the MR read head 58 is shielded from the electromagnetic field of the induction coil 120. Conceivably, the shield diameter could be less than the diameter of the induction coil where effective shielding is still maintained; furthermore, where the shape of the induction coil is other than a generally circular shape, the shield will advantageously, although not necessarily, adopt the same shape as the induction coil. Basically, the shape of the shield 56 is a secondary consideration to its primary role of providing an effective electromagnetic field shield for the read head 58.

A lower portion 158 of the shield 56 preferably extends between the write head pole tip 98 and the MR read head, to shield the MR read head from the intense electromagnetic field at the write head gap 104. The electromagnetic field shield 56 is preferably composed of a non-magnetic, electrically conductive material, such as copper or gold, although other materials may prove equally suitable. To avoid corrosion problems, particularly where the shield is composed of copper, an adequate thickness of insulator material 160 is formed across the lower end 166 of the shield 56. The shield 56 does not require any electrical connection in order to perform its shielding function. As will be understood by those skilled in the art, the thickness of the shield 56 is preferably at least skin depth. Skin depth refers to a thickness of conductive material that is sufficient to absorb the electromagnetic field energy that interacts with it, and skin depth is related to the permeability and conductivity of the material that comprises the shield 56, as well as the operating frequency of the electromagnetic energy that interacts with it. Formulas for determining skin depth are known to those skilled in the art. In the preferred embodiment of the present invention, the shield 56 is composed of copper having a thickness in the range of from approximately 0.5 microns to approximately 25 microns, with a preferred thickness of approximately 10 microns.

Following the formation of the shield element 56, an insulator layer 68 is deposited and the components of the read head 58 are next deposited; the components thereof are known to those skilled in the art. Basically, the read head 58 includes a first magnetic shield 180 and a second magnetic shield 188 and a magnetoresistive (MR) element 192 disposed therebetween. The width 194 of the MR element 192 is preferably significantly less than the width (W) of the gap forming piece 108 of the write head 54, such that the read head 58 will be disposed above the same disk track that the write head 54 is on, even when the read/write head 64 is disposed at a maximum skew angle relative to the track direction, as is discussed herein. In the preferred embodiment, the width 194 of the MR element 192 is from approximately the width (W) of the gap forming piece 108 to approximately 1/10 of the width (W) of the gap forming piece 108. The distance between the write head 54 and read head 58 varies from approximately 1.5 microns to approximately 35 microns depending upon the thickness of the electromagnetic field shield 56, the insulation layers and the MR element shield 180.

As indicated hereabove, the manufacturing process for the read/write head 64 involves thin film processing techniques that are known to those skilled in the art. Of particular concern to the creation of an operable device is that the elements of the MR head 58 be deposited flat and parallel to each other. To achieve this, the manufacturing method of the present invention preferably includes at least one planarization step. Particularly, as depicted in FIG. 6, a planarization layer 196 (shown in phantom) may be formed subsequent to the deposition of the induction coil 120 and the pole tip piece 108. Processes such as chemical-mechanical polishing are utilized to form the planarization layer 196.

The electromagnetic field shield 56 is a significant feature of the present invention in that it allows the write head 54 and the read head 58 to function simultaneously. That is, the read/write head 64 may be utilized to write data on a track and simultaneously read data from the same track because the electromagnetic field shield 56 substantially reduces or eliminates electromagnetic interference between the write head electromagnetic fields and the read head 58 which seeks to detect the magnetic fields of the media passing thereunder. Thus, the read/write head 64 can be utilized to write data and thereafter read the data to verify it in an ongoing process such that the write head 54 and read head 58 are operating simultaneously.

Figure 9:
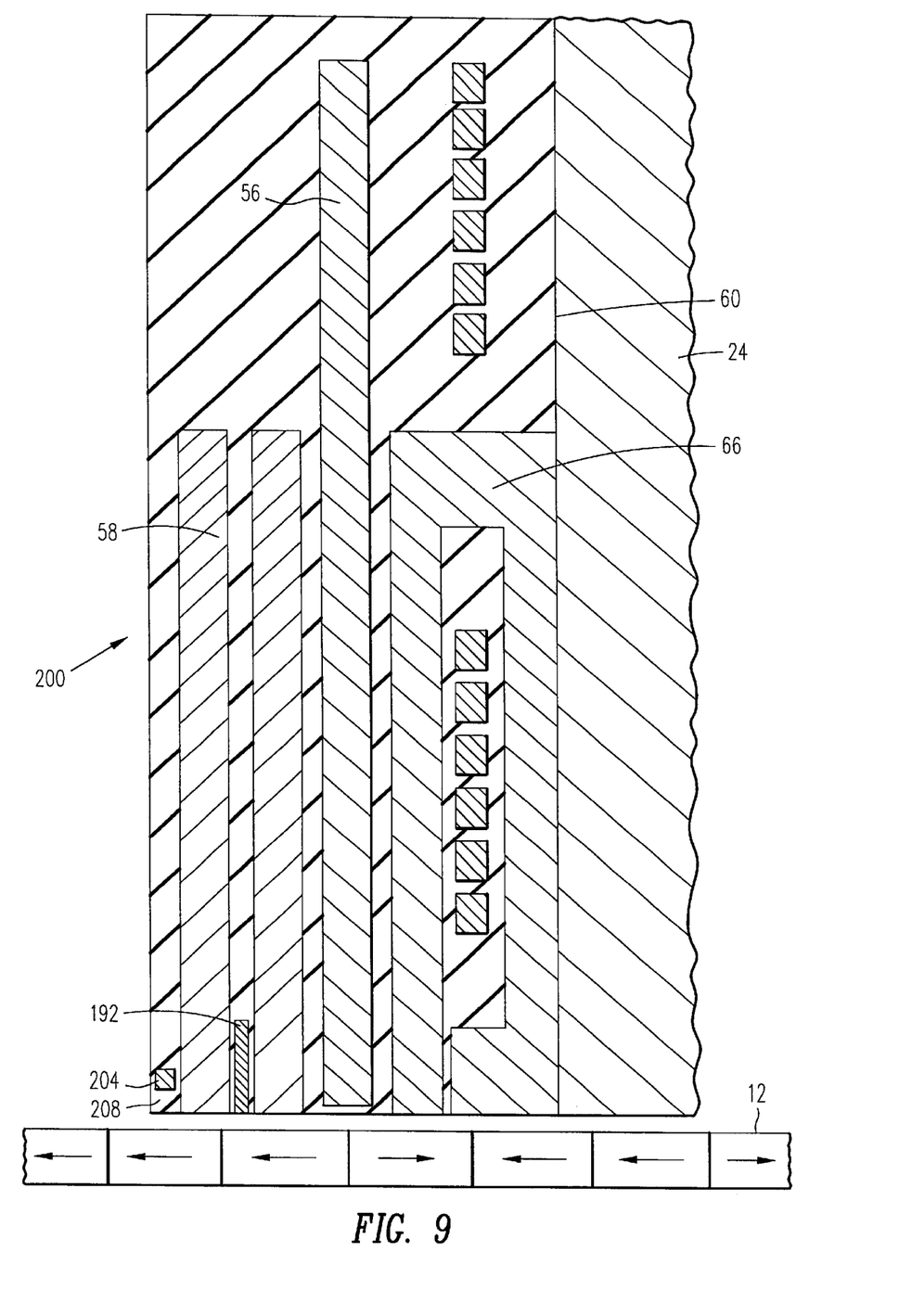
FIG. 9 is a side cross-sectional view of read/write head according to a second embodiment of the present invention that is similar to the view depicted in FIG. 6.
Figure 10:
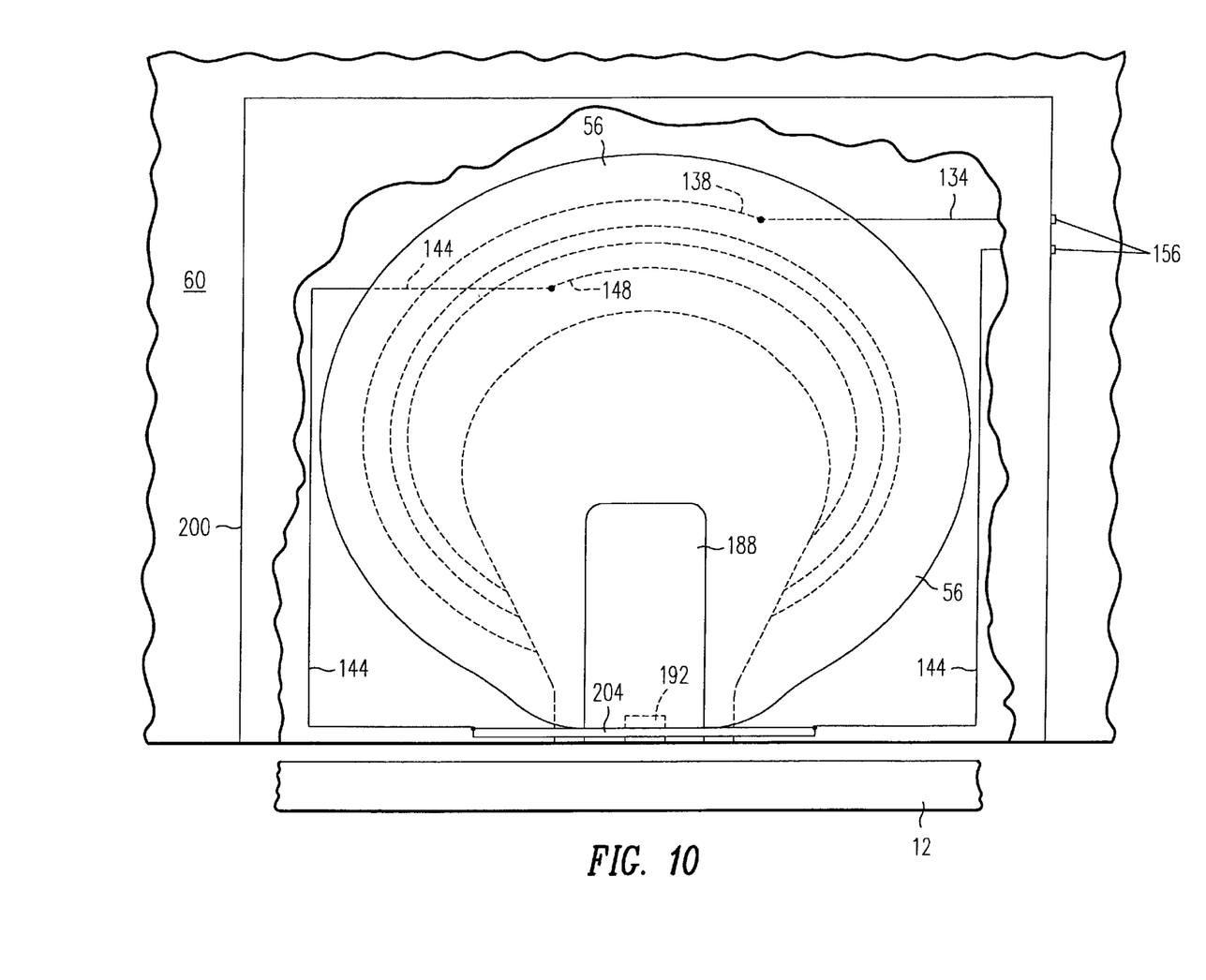
FIG. 10 is an elevational view of the embodiment of the read/write head depicted in FIG. 9 having cut-away portions and being similar to the view depicted in FIG. 7.
Figure 11:
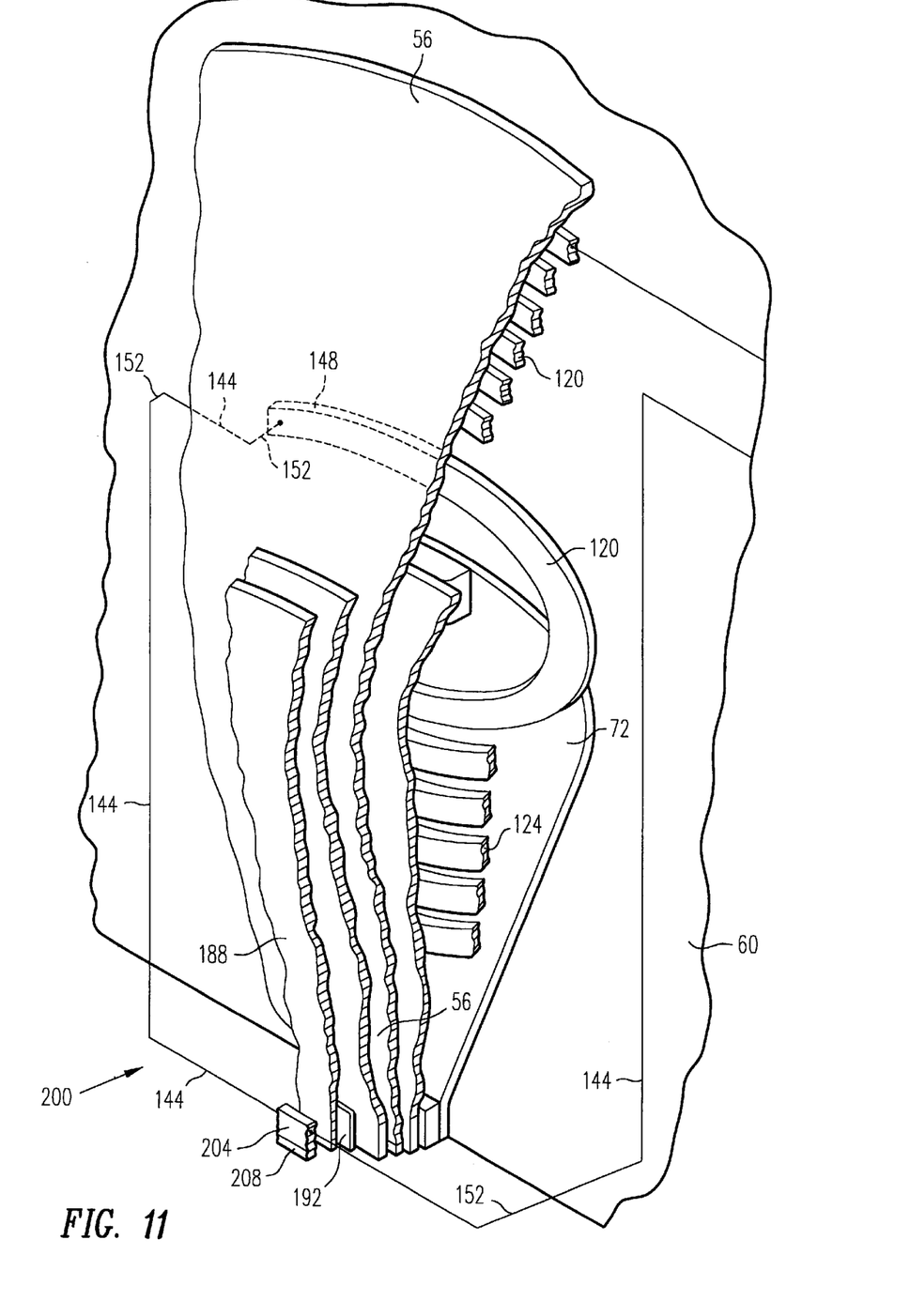
FIG. 11 is a perspective view of the read/write head depicted in FIG. 10 having further cutaway portions to better depict the invention, and being similar to the view depicted in FIG. 8.

A second preferred embodiment 200 of the read/write head 26 that is utilizable in the present invention 10 is depicted in FIGS. 9, 10 and 11, wherein FIG. 9 is a side cross-sectional view of the read/write head 200 that is similar to the view depicted in FIG. 6, FIG. 10 is a plan view that is similar to the view depicted in FIG. 7, and FIG. 11 is a perspective view that is similar to the view depicted in FIG. 8. As will be understood from the following description, the read/write head 200 of the second embodiment possesses many of the same elements as are found in the read/write head 64, and identical numerals are utilized to identify identical structural elements. The novel additional feature of the read/write head 200 comprises the placement of an electrically conductive circuit line element 204 behind the read head 58 to provide an electromagnetic field which interferes with and reduces the electromagnetic field at the read head MR element 192 that is caused by the write head and not absorbed by the electromagnetic field shield 56, as is next described.

As depicted in FIGS. 9, 10 and 11, the read/write head 200 includes an inductive write head 54 that is disposed proximate the rear surface 60 of the slider 24. An electromagnetic field shield 56 is disposed behind the write head 54 and a read head 58 is disposed behind the shield 56. An electrically conductive circuit line 204 is deposited behind the read head 58 such that a layer of insulation separates the electrically conductive circuit line 204 from the second magnetic shield 188 of the read head 58. The conductive line element 204 is deposited proximate the MR element 192, and a sufficient thickness of insulator material 208 may be disposed beneath the element 204 to prevent corrosion problems, particularly where the element 204 is composed of copper.

Electrical power for the conductive line element 204 is provided through the induction coil circuitry. That is, the electrical line 144 from the inner end 148 of the induction coil is routed to and through the electrical conductive line element 204, in distinction to its routing in the read/write head embodiment 64 as is best depicted in FIG. 8. Particularly, as is best seen in FIG. 11, the electrical lead 144 is fed through vias 152 around the shield 44 and outwardly to the substrate layer that includes the electrical conductive line element 204. The electrical lead 144 passes to and through the electrical conductive line element 204 and thence inwardly and upwardly to its outer terminal connection 156. An important feature of the read/write head 200 is that no new electrical connections or additional read/write head terminals are required to obtain the performance enhancement provided by the electrical conductive line element 204. This is because the electrical lead 144 of the induction coil 120 is routed through the conductive line element 204 and thence to the terminal 156.

It is therefore to be understood that the electrical current that passes through the induction coil 120 to create the electromagnetic field for the write head, also passes through the conductive line element 204, such that it creates a small electromagnetic field by its passage through the conductive line element 204. Furthermore, as will be understood by those skilled in the art, owing to the direction of the electrical current through the conductive line element 204, the electromagnetic field generated by the conductive line element 204 is directed oppositely to the electromagnetic field that is generated by the write head 54. That is, with specific regard to the location of the MR element 192, where the write head 54 (according to the right hand rule) creates a generally downward electromagnetic field at the MR element 192, the conductive line element 204 creates a generally upward electromagnetic field; whereby the electromagnetic field of the conductive line element 204 acts to interfere with and cancel the effects of the electromagnetic field generated by the write head 54. Thus, where the electromagnetic field shield 56 imperfectly blocks the effects of the electromagnetic field generated by the write head 54, the conductive line element 204 generates an interfering electromagnetic field that acts to cancel the effect of the write head electromagnetic field upon the MR element 192. The conductive line element 204 in the read/write head embodiment 200 therefore enhances the ability of the write head 54 and the read head 58 to function simultaneously and with reduced interference, such that the read/write head 200 is able to write data and read data simultaneously.

It is also therefore to be understood that utilizing prior art read/write heads in disk certification, the write head and the read head cannot be simultaneously operated. Thus, during one turn of the disk the write head operates and during a subsequent turn of the disk the read head operates, and certification of a track therefore requires at least two turns of the disk. Additionally, due to read/write head stabilization and drifting problems, significant time is expended in the prior art certification methods in the head travel from track to track. An advantage of the read/write head 26 of the present invention, is that writing and reading occur simultaneously, whereby in the certification method of the present invention a single turn of the disk is sufficient to certify a track. Additionally, the continuous, simultaneous operation of the write and read heads of the present invention permits the utilization of the spiral track certification method, which is not possible where the write head and read head cannot be operated continuously and simultaneously. Where the prior art certification testing may actually test less than 1% of the disk surface, with the present invention it is possible to economically test at least approximately 10% of the disk surface. Of course, with greater time it is possible to test 100% of the surface of the disk utilizing the present invention in a significantly reduced time as compared with the prior art.

Because the tester 10 described in this invention uses only one head, and hence requires one set of scanner, controller and electronics, a low-cost approach of using most of the existing equipment for disk certification testing is realized. Most importantly, the one-head configuration eliminates the need for head-to-head location alignment of two headed certifiers as well as the need to maintain head-to-head scanning control.

While the present invention has been shown and described with regard to certain preferred embodiments, it is understood that alterations and modifications thereof will become apparent to those skilled in the art upon reading the preceding disclosure. It is therefore intended that the following claims cover all such alterations and modifications that nevertheless include the true spirit and scope of the invention.

What I claim is:

1. A method for certifying a disk comprising the steps of:
   rotating a disk to be certified utilizing a disk rotation device;
   writing information to said disk using a write head of a single read/write head;
   reading information from said disk using a read head of said single read/write head;
   analyzing said information read from said disk to determine whether defects exist in said disk; and
   wherein said steps of writing information and reading information are performed simultaneously.

2. A method for certifying a disk as described in claim 1 wherein said steps of writing information and reading information are performed continuously.

3. A method for certifying a disk as described in claim 1 wherein said step of writing information includes the further step of writing said information on a spiral path on said disk.

4. A method for certifying a disk as described in claim 3 wherein said spiral path is formed with varying degrees of tightness to its spiral.

5. A method for certifying a disk as described in claim 3 wherein said spiral path includes a relatively tight spiral portion on an inner portion of said disk a relatively loose spiral portion on a mid-portion of said disk and a relatively tight spiral portion on an outer portion of said disk.

6. A method for certifying a disk as described in claim 1 wherein said step of writing information to said disk includes the step of continuously moving said read/write head.

7. A method for certifying a disk as described in claim 1, including the further steps of:
   shielding electromagnetic field energy generated by said write head by utilizing an electromagnetic field shield that is disposed between said write head and said read head.

8. A method for certifying a disk as described in claim 7 wherein said read/write head is disposed upon a slider device, and wherein said write head is disposed upon a surface of said slider device, and said electromagnetic field shield is disposed behind said write head, and said read head is disposed behind said shield.

9. A method for certifying a disk as described in claim 8 including the further step of generating an interference electromagnetic field at said read head, said interference electromagnetic field being directed oppositely to an electromagnetic field that is generated by said write head at said read head.

10. A method for certifying a disk as described in claim 9 including the further step of generating said interference electromagnetic field simultaneously with said step of writing information.

11. A method for certifying a disk as described in claim 10 including the further step of providing electrical current to said write head and simultaneously providing electrical current to generate said interference electromagnetic field.

12. A method for certifying a disk as described in claim 11 wherein said electrical current that is provided to said write head is also utilized to generate said interference electromagnetic field.

13. A hard disk certifying device, comprising:
   a disk rotating means functioning to rotate a disk to be tested;
   a read/write head including both a write head and a read head;
   a read/write head holding means functioning to movably support said read/write head;
   a read/write head control electronics means functioning to provide write signals to said write head and receive read signals from said read head;
   computer means functioning to control said disk rotating means, read/write head holding means and said read/write head control electronics means, and to analyze said read signals to determine whether defects exist in said disk; and
   wherein said read/write head control electronics means simultaneously provides said write signals and receives said read signals.

14. A hard disk certifying device as described in claim 13 wherein said read/write head control electronics means continuously provides said write signals and receives said read signals.

15. A hard disk certifying device as described in claim 13 wherein information is written on said disk by said write head in a spiral path.

16. A hard disk certifying device as described in claim 15 wherein said spiral path is formed with varying degrees of tightness to its spiral.

17. A hard disk certifying device as described in claim 15 wherein said spiral path includes a relatively tight spiral portion on an inner portion of said disk, a relatively loose spiral portion on a mid-portion of said disk, and a relatively tight spiral portion on an outer portion of said disk.

18. A hard disk certifying device as described in claim 15 wherein said read head is disposed behind said write head.

19. A hard disk certifying device as described in claim 13 further including:
   an electromagnetic field shield being disposed between said write head and said read head and functioning to shield said read head from electromagnetic field energy created by said write head.

20. A hard disk certifying device as described in claim 19 wherein said write head is disposed upon a slider surface, said electromagnetic field shield is disposed upon said write head and said read head is disposed upon said electromagnetic field shield.

21. A hard disk certifying device as described in claim 13 further including an electromagnetic field interference means being disposed proximate said read head and functioning to generate an electromagnetic field at said read head that is generally oppositely directed to an electromagnetic field at said read head generated by said write head.

22. A hard disk certifying device as described in claim 13 further comprising a conductive line connected to the write head and wherein said conductive line passes proximate to the read head so that an electrical current flowing in said conductive line will generate an electromagnetic field at said read head which is essentially oppositely directed to an electromagnetic field at said read head generated by said write head.

23. A hard disk certifying device as described in claim 22 wherein said electrical current also passes through said write head.

24. A hard disk certifying device as described in claim 13 wherein said read head includes a MR head, wherein said write head is formed with a write head tip having a tip width W, and wherein said MR element has a width that is from approximately W to approximately 1/10th of W.

* * * * *